(12) United States Patent
Krishnamoorthy et al.

(10) Patent No.: US 7,233,163 B2
(45) Date of Patent: *Jun. 19, 2007

(54) MAPPING VARIATIONS IN LOCAL TEMPERATURE AND LOCAL POWER SUPPLY VOLTAGE THAT ARE PRESENT DURING OPERATION OF AN INTEGRATED CIRCUIT

(75) Inventors: Arun Krishnamoorthy, Portland, OR (US); Abram M. Detofsky, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 11/405,882

(22) Filed: Apr. 18, 2006

(65) Prior Publication Data

US 2006/0186910 A1    Aug. 24, 2006

Related U.S. Application Data

(62) Division of application No. 10/851,631, filed on May 21, 2004, now Pat. No. 7,071,723.

(51) Int. Cl.
*G01R 31/26* (2006.01)
(52) U.S. Cl. .................. 324/765; 324/763; 702/132
(58) Field of Classification Search ............. None
See application file for complete search history.

(56) References Cited

U.S. PATENT DOCUMENTS

| | | | |
|---|---|---|---|
| 4,656,369 A | 4/1987 | Lou | |
| 5,638,418 A | 6/1997 | Douglass et al. | |
| 5,795,068 A * | 8/1998 | Conn, Jr. ................ | 374/170 |
| 6,094,104 A | 7/2000 | Morgan | |
| 6,535,013 B2 | 3/2003 | Samaan | |
| 6,553,545 B1 | 4/2003 | Stinson et al. | |
| 6,882,238 B2 | 4/2005 | Kurd et al. | |
| 7,069,459 B2 * | 6/2006 | Gauthier et al. ......... | 713/401 |
| 2004/0181705 A1 | 9/2004 | Gauthier et al. | |

OTHER PUBLICATIONS

Fruchter, A.S. and Hook, R.N. "Drizzle: A Method for the Linear Reconstruction of Undersampled Images", Space Telescope Science Institute, arXiv:astro-ph/9808087 v2, Oct. 19, 2001, 19pgs.

Lauer, Tod R. "Combining Undersampled Dithered Images", National Optical Astronomy Observatories, arXiv:astro-ph/9810394 v1, Oct. 23, 1998, 22pgs.

Fruchter, A.S. and Hook, R.N. "A novel image reconstruction method applied to deep Hubble Space Telescope images", Space Telescope Science Institute, arXiv:astro-ph/97082242 v1, Aug. 26, 1997, 6 pgs.

Bracewell, R.N., "The Fourier Transform and its Applications—Chapter 10 Sampling and series", McGraw-Hill, pp. 189-218, Jun. 1999.

* cited by examiner

*Primary Examiner*—Minh N. Tang
(74) *Attorney, Agent, or Firm*—Buckley, Maschoff & Talwalkar LLC

(57) ABSTRACT

A method includes providing an integrated circuit (IC) having a plurality of oscillators at distributed locations in the IC, determining a respective rate of oscillation of each of the oscillators, and detecting variations in local temperature in the IC based on the determined rates of oscillation. Other embodiments are described and claimed.

6 Claims, 11 Drawing Sheets

Time

Time

Time

MAPPING VARIATIONS IN LOCAL TEMPERATURE AND LOCAL POWER SUPPLY VOLTAGE THAT ARE PRESENT DURING OPERATION OF AN INTEGRATED CIRCUIT

CROSS REFERENCE TO RELATED APPLICATION

This is a divisional of prior U.S. patent application Ser. No. 10/851,631, filed May 21, 2004, now U.S. Pat. No. 7,071,723.

BACKGROUND

During operation of an integrated circuit (IC) such as a microprocessor, there may be local variations in temperature and in the power supply voltage across the IC die.

Locations in the IC which experience higher temperatures than other locations are sometimes referred to as "hot spots" and may present significant challenges to the system or systems provided to cool the IC during operation. The issue of hot spots may compound the already significant demands placed on cooling systems by the ever increasing operating rates and rates of power dissipation by microprocessors.

Moreover, the local increase in temperature at a hot spot may adversely affect the operating speed of components at the hot spot, potentially causing the IC to fail to meet the intended operating rate.

Also, hot spots may migrate from location to location on the IC die, as different applications are executed. This further complicates implementation of designs to minimize hot spots.

Local variations in the supply voltage may also adversely affect operation of an IC. The operating rate of components of the IC tends to be reduced by localized reductions in supply voltage, potentially leading to overall failure of the IC due to, e.g., failing race conditions.

During testing of an IC design, it would be desirable to obtain relatively detailed, and substantially real-time, maps of local variations in temperature and supply voltage, to aid in arriving at design solutions to mitigate and/or avoid the adverse consequences of such variations. However, conventional techniques for detecting temperature and supply voltage variations tend to be limited, expensive, time-consuming and/or unsatisfactory. For example, so-called $V_{cc}$ sense pins on an IC package allow for detection of the local supply voltage level at a few locations on the IC die, but do not permit a detailed supply voltage map to be generated. Temperature maps may be generated based on simulations, which may not be accurate, or based on empirical data obtained by Infra-red Emission Microscopy (IREM). The latter technique, though accurate, is disadvantageous in that it is very time-consuming and involves destruction of the device under test (DUT).

Accordingly, improved techniques for mapping temperature and supply voltage variations on an IC die are needed.

DETAILED DESCRIPTION

Figure 1:
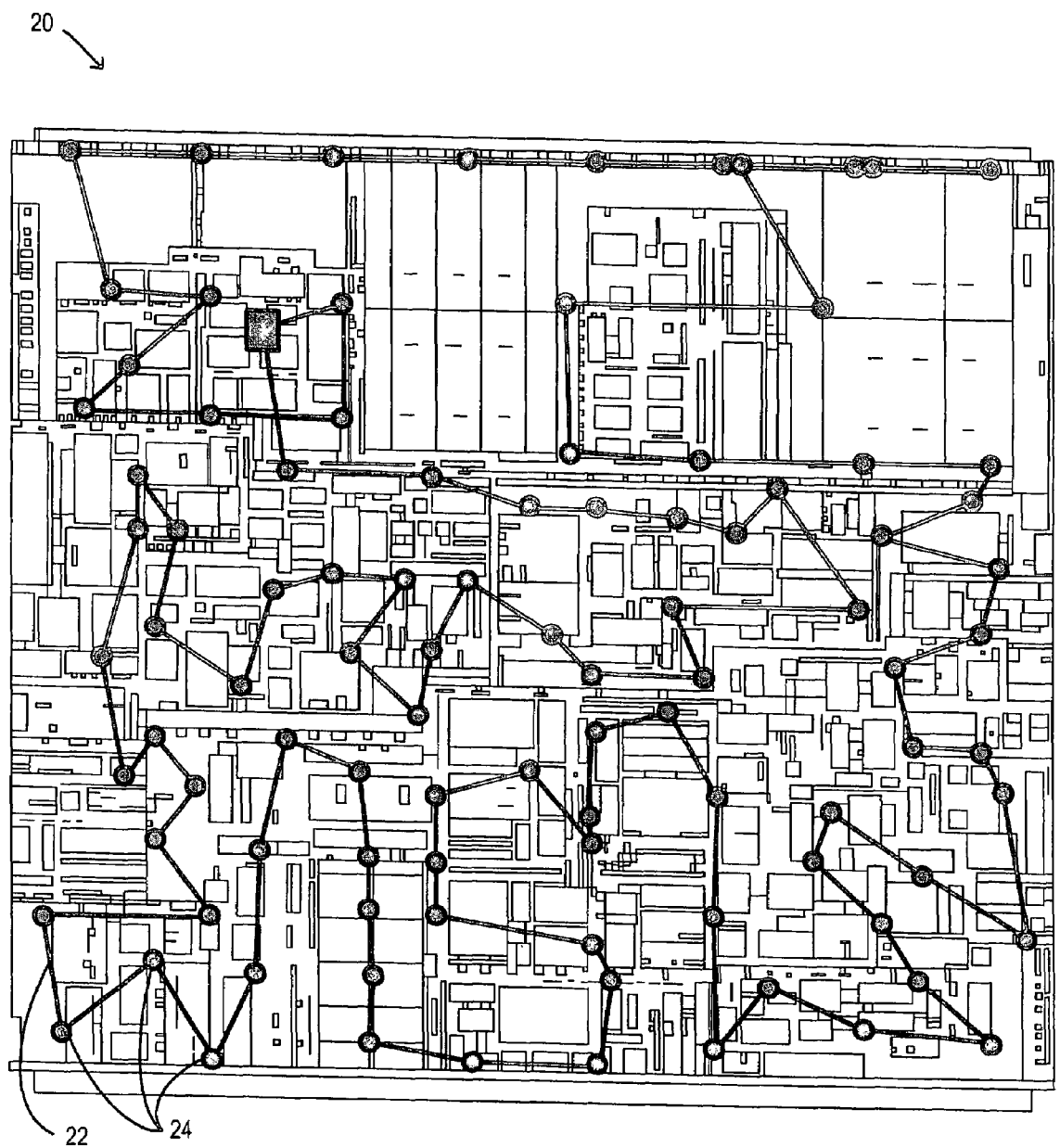
FIG. 1 is a somewhat schematic plan view of a microprocessor provided with distributed sets of oscillators that are scannable for test purposes in accordance with some embodiments.

FIG. 1 is a somewhat schematic plan view of a microprocessor 20. In this example, the microprocessor 20 exhibits features of the well-known Pentium ® microprocessor architecture produced by Intel Corporation, the assignee hereof.

It has been proposed to include in the circuitry of a microprocessor or other IC so-called process monitoring circuitry. An example of such circuitry is disclosed in U.S. Pat. No. 6,553,545, which is commonly assigned herewith. Such circuitry is also sometimes referred to as Intra-Die Variation (IDV) probe circuitry, and may include groups of oscillators at distributed locations in the IC die. For example, there may be 98 clusters of 15 oscillators each provided in one example microprocessor. Typically, each oscillator may be constructed as a ring oscillator. Each cluster may be referred to as a "fublet", deriving its name from the term "Functional Unit Block" or FUB. The oscillators in each fublet may differ from each other in terms of such characteristics as number of inverter stages, spatial orientation, and local transistor characteristics, to allow for detection of various types of process variation. By design each fublet may contain an identical set of oscillators, though differences in oscillator characteristics arise between the fublets as a result of process variations.

In addition to oscillators, each fublet may include a counter or counters to record the oscillation rate of each oscillator. The fublets may be linked by a scan chain which allows the contents of the counters to be read out via a so-called test access port ("TAP", not separately shown) of the IC. The respective frequencies of oscillation of the oscillators may be examined to obtain information about process variations across the IC die. In other embodiments, a single counter may be provided on the IC die to be shared by all of the oscillators to output count data seriatim for each of the oscillators.

Reference numeral 22 in FIG. 1 indicates a scan chain of the type referred to in the previous paragraph, and the dots 24 (most not directly associated with a reference numeral) strung along the scan chain 22 each represent a respective fublet. Thus the dots along the scan chain 22 are indicative of the distribution of fublets on the IC 20.

In accordance with various embodiments, it is now proposed that the IDV circuitry also be employed to provide temperature and/or supply voltage maps of the IC and/or to detect local supply voltage transient events (e.g., "droops") during test operation of the IC and/or to detect longer term voltage events ("sags") during operation of the IC.

Figure 2:
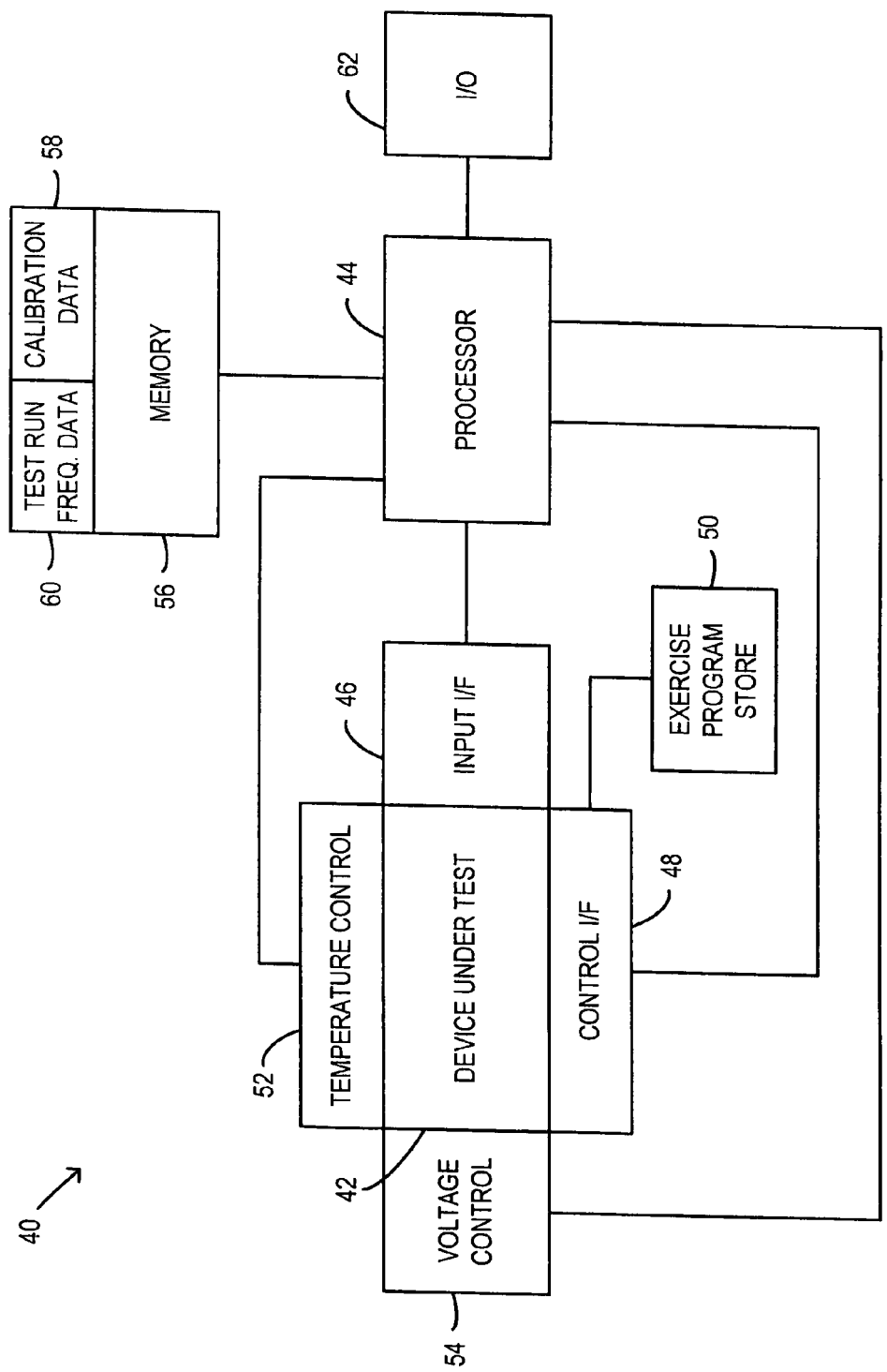
FIG. 2 is a block diagram of a set-up provided according to some embodiments for testing of the microprocessor of FIG. 1.

FIG. 2 is a block diagram of a test set-up 40 provided according to some embodiments for testing of the microprocessor 20, indicated as the device under test, or DUT (reference numeral 42), in FIG. 2. The test set-up 40 includes a processor 44, which may include one or more suitably programmed microprocessors (not separately shown). Also included in the test set-up 40 is an input interface 46 which is coupled to the processor 44. A function of the input interface 46 may be to couple to the test access port of the DUT 42 to receive oscillation rate data from the scan chain 22 via the TAP. The oscillation rate data may be indicative of a respective rate of oscillation of each one of at least some of the oscillators (not separately shown) of the fublets 24.

The test set-up 40 may further include a control interface 48 coupled to the processor 44. A function of the control interface 48 may be to couple to the DUT 42 to cause the DUT to run one or more test programs or other programs, which may be stored in an exercise program store 50 associated with the control interface 48. As will be appreciated by those who are skilled in the art, causing the DUT to run one or more programs while in the test set-up may be referred to as "exercising" the DUT.

The test set-up 40 may also include a temperature control device 52, such as a conventional heat exchanger, to control the temperature of the DUT so that the DUT is at a temperature dictated by the processor 44. The temperature control device 52 is coupled to the processor 44 and operates under the control of the processor 44.

In addition, the test set-up 40 may include a voltage control device 54 which is coupled to the processor 44 and which operates, under the control of the processor 44, to control the level of the power supply voltage (also referred to as "$V_{CC}$") supplied to the DUT via a power plane (not separately shown) of the DUT.

The test set-up 40 may further include one or more memory and/or storage devices, collectively represented by a block 56 in FIG. 2. The device(s) 56 may serve as program memory to store one or more programs to control operation of the processor 44 in accordance with embodiments described herein. In addition, the device(s) 56 may function as working memory and, at various times during operation of the test set-up 40, may hold calibration data 58 (to be discussed below) and oscillator frequency data 60 gathered during testing of the DUT 42.

Also, the test set-up 40 may include various input/output devices (block 62) coupled to and/or controlled by the processor 44. For example, the I/O devices 62 may include a conventional user interface including a color computer display monitor, a keyboard and a mouse, as well as a color printer to print out temperature and/or supply voltage maps as discussed below. (The specific I/O devices are not separately shown.)

Figure 3:
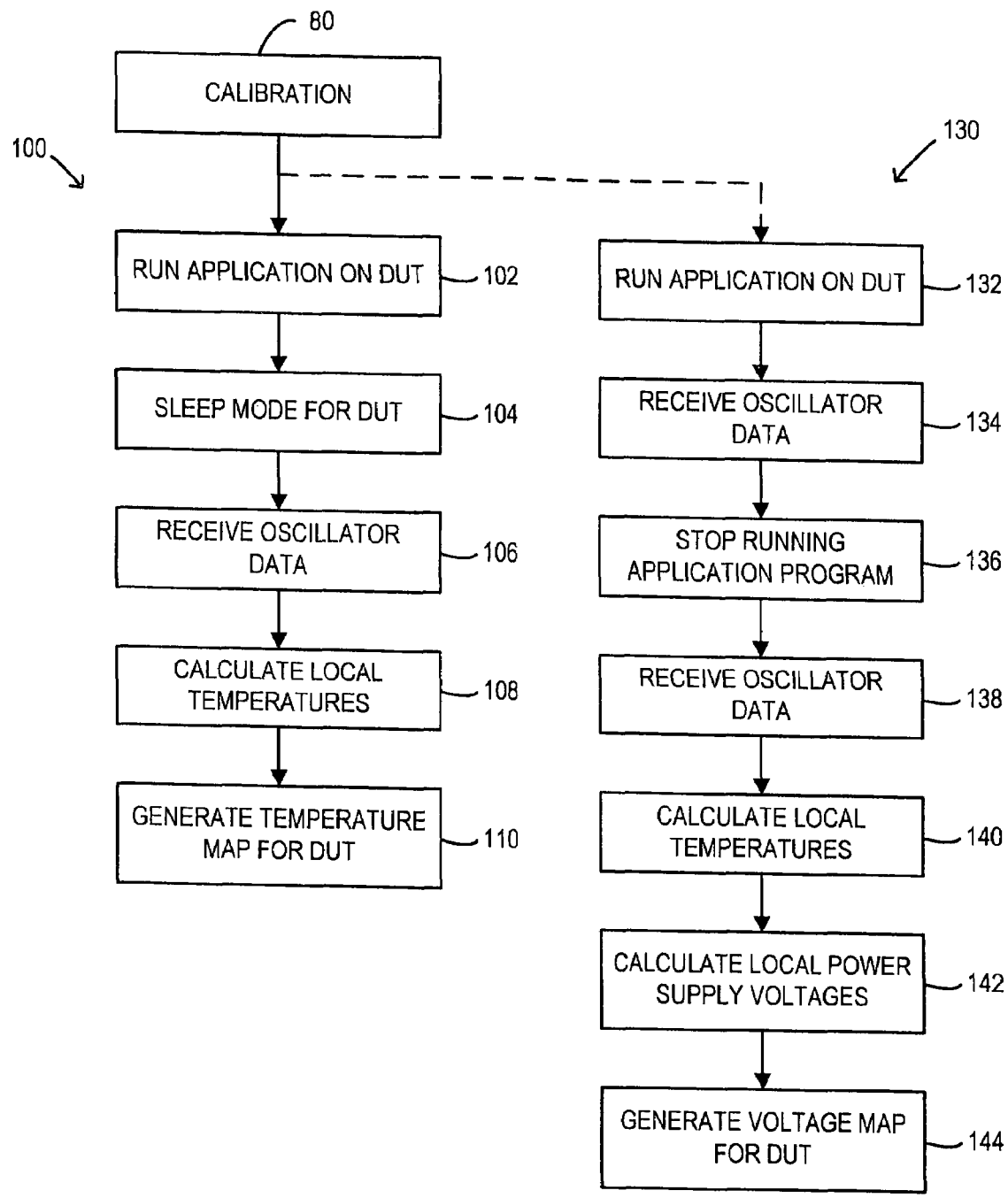
FIG. 3 is a flow chart that illustrates a process that may be performed according to some embodiments using the test set-up of FIG. 2.

FIG. 3 is a flow chart that illustrates a process that may be performed according to some embodiments using the test set-up 40.

Initially, as indicated at 80 in FIG. 3, the process may involve a calibration procedure, in which a respective temperature- and voltage-dependent frequency function is determined for each one of a plurality of the IDV oscillators. The determination of such a function for an IDV oscillator will be referred to as "characterization" of the oscillator. In some embodiments, one oscillator is characterized in each of the fublets during calibration. The oscillators selected for characterization may be essentially identical to each other, except for process variations experienced across the DUT during fabrication thereof. In other words, all of the oscillators selected for characterization may be designed to be identical.

In other embodiments, two oscillators (a pair of oscillators) may be selected from each fublet for characterization. The selected pair of oscillators from each fublet may include a first oscillator and a second oscillator which are expected, because of their respective designs, to have significantly different frequency functions from each other.

All of the "first" oscillators may be designed to be identical to each other, and all of the "second" oscillators may be designed to be identical to each other (though different from the first oscillators, as noted above).

Figure 4:
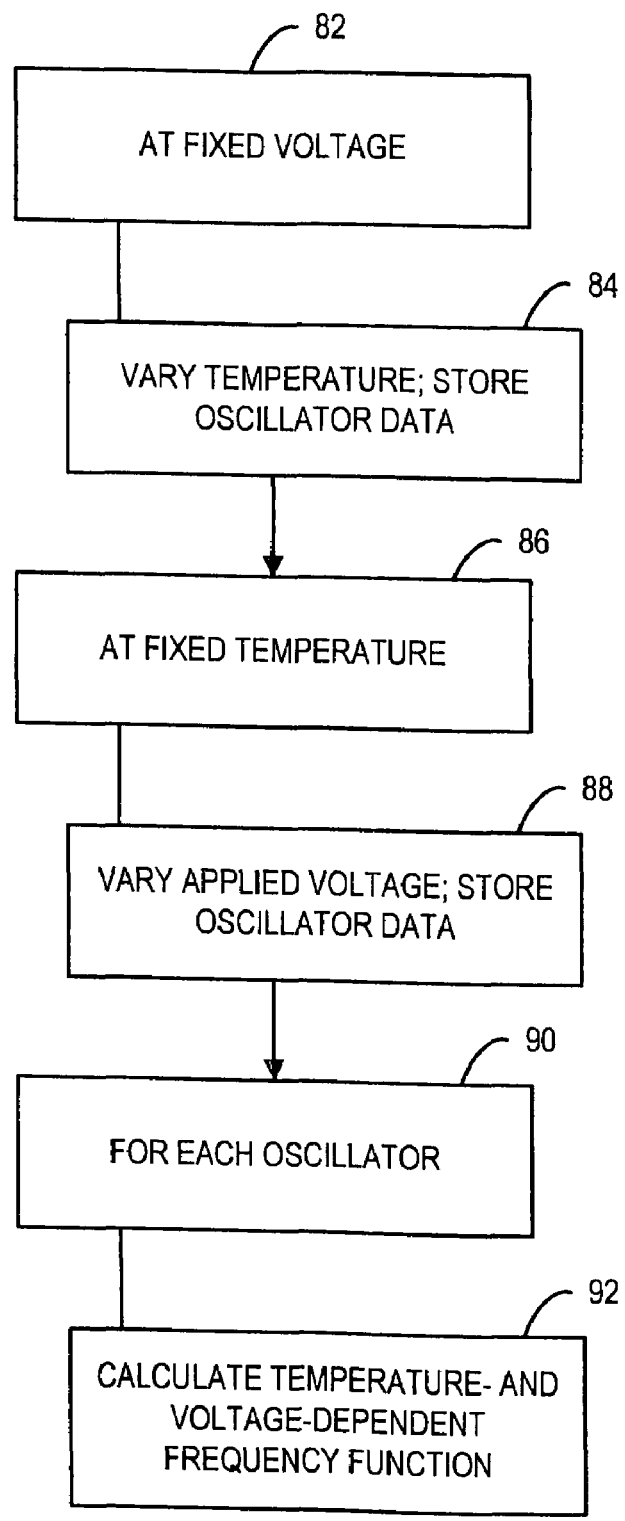
FIG. 4 is a flow chart that illustrates some details of a calibration stage of the process of FIG. 3.

FIG. 4 is a flow chart that illustrates some details of an example calibration procedure.

As indicated at 82 and 84 in FIG. 4, the level of $V_{CC}$ applied to the DUT may be held fixed initially, and the temperature of the DUT may be varied by operation of the temperature control device 52. For example, the temperature applied to the DUT may be varied in steps of 5° C. The temperature may be held at each step for a sufficient period to "soak" the DUT to thermal saturation, and while the temperature is being held, oscillation data may be read out from the scan chain 22 via the TAP of the DUT for each oscillator that is to be characterized, to measure the frequency of the oscillator at the current temperature. The oscillation data received via the TAP may be stored in the memory device(s) 56.

One issue that may require consideration in terms of temperature setting during calibration is so-called "self-heating", i.e., heating of the DUT as a result of power dissipated within the DUT during testing. To minimize self-heating, it may be desirable to maintain the DUT in an idle state during calibration, e.g., a state with all core clocks in a "sleep" or standby mode. However, even in such a state, there may remain a significant amount of power dissipation due to leakage by the numerous transistors that typically may be present in the DUT. As a result, the actual temperature at the DUT itself may be higher than the temperature attempted to be set by using the temperature control device 52. However, it may be possible to measure the actual temperature by using a thermal diode (not separately shown) that typically may be included at one location on the DUT. It may be desirable to use the actual measured temperature, rather than the temperature control device set point, in calculating the frequency function for the oscillators selected for characterization. Also, to minimize potential non-uniformity of the actual temperature across the DUT during calibration, it may be desirable to limit the set point temperatures and the $V_{CC}$ levels applied to the DUT during calibration.

Before, after or interspersed with the measurements made at various temperature steps, the temperature may be held fixed and the level of $V_{CC}$ applied to the DUT may be varied by operation of the voltage control device 54, as indicated at 86 and 88 in FIG. 4. For example, the level of $V_{CC}$ applied to the DUT may be varied in steps of 50 mV (e.g., in the vicinity of a typical $V_{CC}$ level such as 1.4 V). With $V_{CC}$ at each step level, oscillation data may be read out from the scan chain 22 via the TAP of the DUT for each oscillator that is to be characterized, to measure the frequency of the oscillator at the current $V_{CC}$ level. The oscillation data received via the TAP may be stored in the memory device(s) 56.

Figure 5:
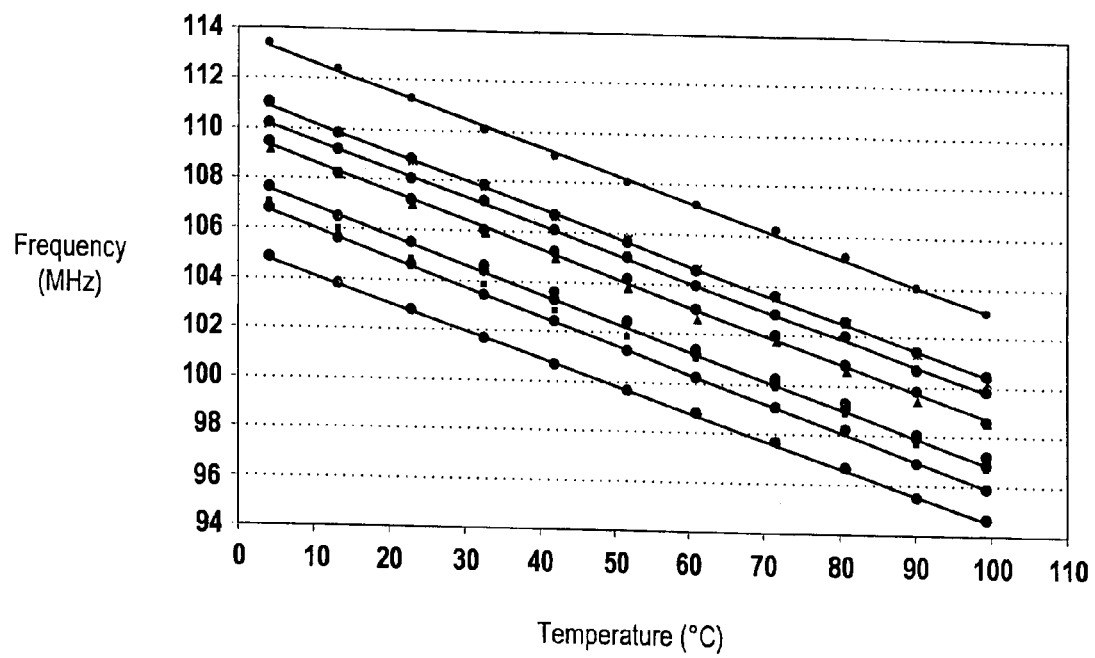
FIG. 5 graphically illustrates temperature-dependent variations in oscillating frequency of some of the scannable oscillators of the microprocessor of FIG. 1.

Typically the IDV oscillators are such that changes in temperature or $V_{CC}$ cause a linear change in oscillating frequency. For example, FIG. 5 graphically illustrates temperature-dependent variations in oscillating frequency of some IDV oscillators, where each data line in FIG. 5 corresponds to a respective IDV oscillator, and all of the oscillators are designed to be identical, but are located in mutually different fublets. The divergence of slopes in the data lines will be noted and indicates differences in characteristics among the oscillators due to process variations.

As indicated at 90 and 92 in FIG. 4, for each oscillator to be characterized, a respective temperature- and voltage-dependent frequency function may be calculated based on the oscillation data collected at 84 and 88. The function for each oscillator to be characterized may take the form:

$$F = aT + bV + c,$$

where F represents frequency, a and b are respectively slope values for temperature and voltage level derived from the oscillation data, c is a linear offset derived from the oscillation data, T represents temperature and V represents $V_{cc}$ level. The values of a, b, and c may be determined by fitting a plane to the data points generated at 84 and 88.

Figure 6:
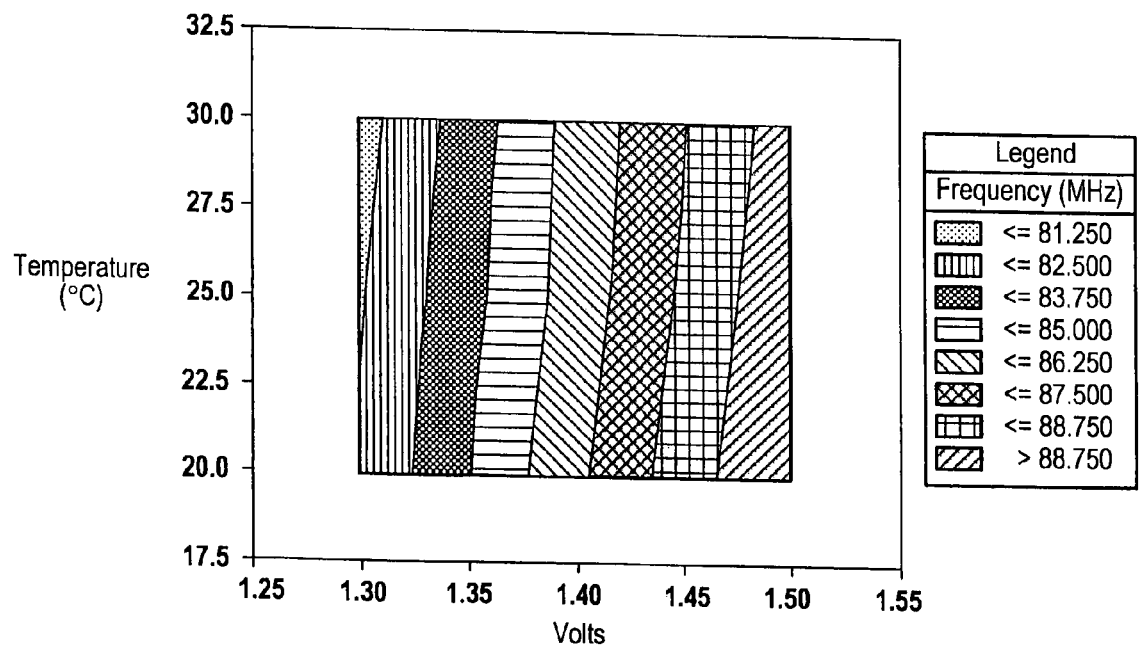
FIG. 6 graphically illustrates temperature- and voltage-dependent variations in oscillating frequency of one of the oscillators.

FIG. 6 graphically illustrates temperature- and voltage-dependent variations in oscillating frequency of one of the IDV oscillators.

Once the calibration procedure is complete, the test set-up 40 may be operated to detect either or both of local variation in temperature and power supply voltage in the DUT and/or to generate one or both of temperature and voltage maps for the DUT. As used herein and in the appended claims, "temperature map" refers to a graphical representation of variation in local temperature relative to location on an IC die, and "voltage map" refers to a graphical representation of variation in power supply voltage relative to location on an IC die.

Referring once more to FIG. 3, detection of local temperature variations and generation of a temperature map will be described with reference to a left-hand branch 100 of the flow chart shown in FIG. 3. Initially in the branch 100, as indicated at 102, the test set-up 40 may control the DUT 42 to run a suitable test application program. For example, the test application may be a conventional test program which tends to cause a maximum of power dissipation by the DUT. The test program may be run on the DUT in a loop until the DUT reaches thermal and electrical equilibrium.

To eliminate the effect of local voltage sags, which are not quantifiable, the core clock(s) may be stopped and the DUT placed in a sleep mode, as indicated at 104. The sleep mode may be maintained for about one millisecond, which is not long enough to allow significant cooling of the DUT, but is likely to be long enough to allow overshoot and ringing in the power supply to settle out. Then, approximately one millisecond into the sleep mode, the oscillation data for the characterized oscillators may be read out via the scan chain 22 and the TAP of the DUT and may be received by the test set-up 40, as indicated at 106. The respective frequencies (rates of oscillation) of the characterized oscillators may then be determined based on the oscillation data. Taking into account the current $V_{CC}$ level applied to the DUT, and the frequency function determined for each characterized oscillator during calibration, a respective local temperature may be calculated for each fublet (as indicated at 108), thereby detecting variations in local temperature in the DUT based on the respective frequencies of the characterized oscillators.

Figure 7:
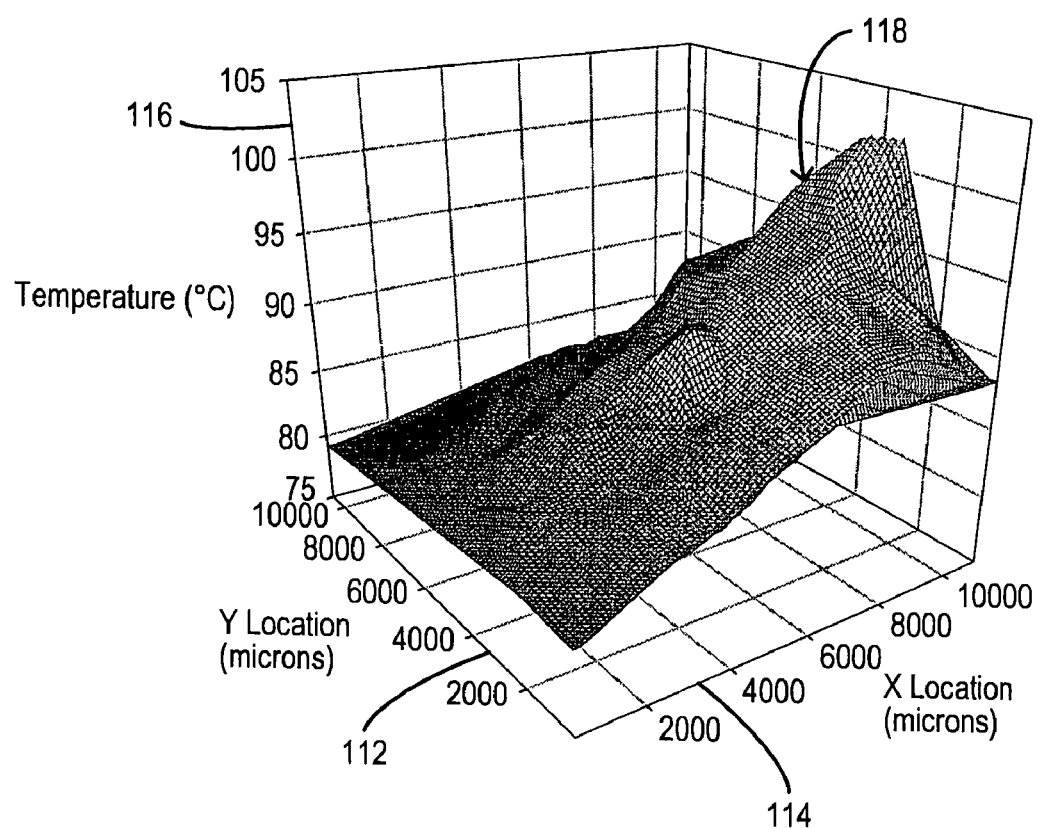
FIG. 7 illustrates one form of a temperature map that may be provided according to some embodiments.

Next, as indicated at 110, the processor 44 may operate to generate a temperature map for the DUT based on the local temperatures calculated at 108. One example of such a temperature map is shown in FIG. 7. In FIG. 7, a first horizontal direction axis 112 is indexed according to location on the IC die in a "Y" direction, a second horizontal direction axis 114 is indexed according to location on the IC die in an "X" direction, and the vertical direction axis 116 represents temperature. Note that the mapping 118 indicates a local increase in temperature of some 20° C. at the right-hand side of the die at around 4000 microns in the Y direction. This corresponds to the locus of a high-speed execution unit of the IC.

Figure 8:
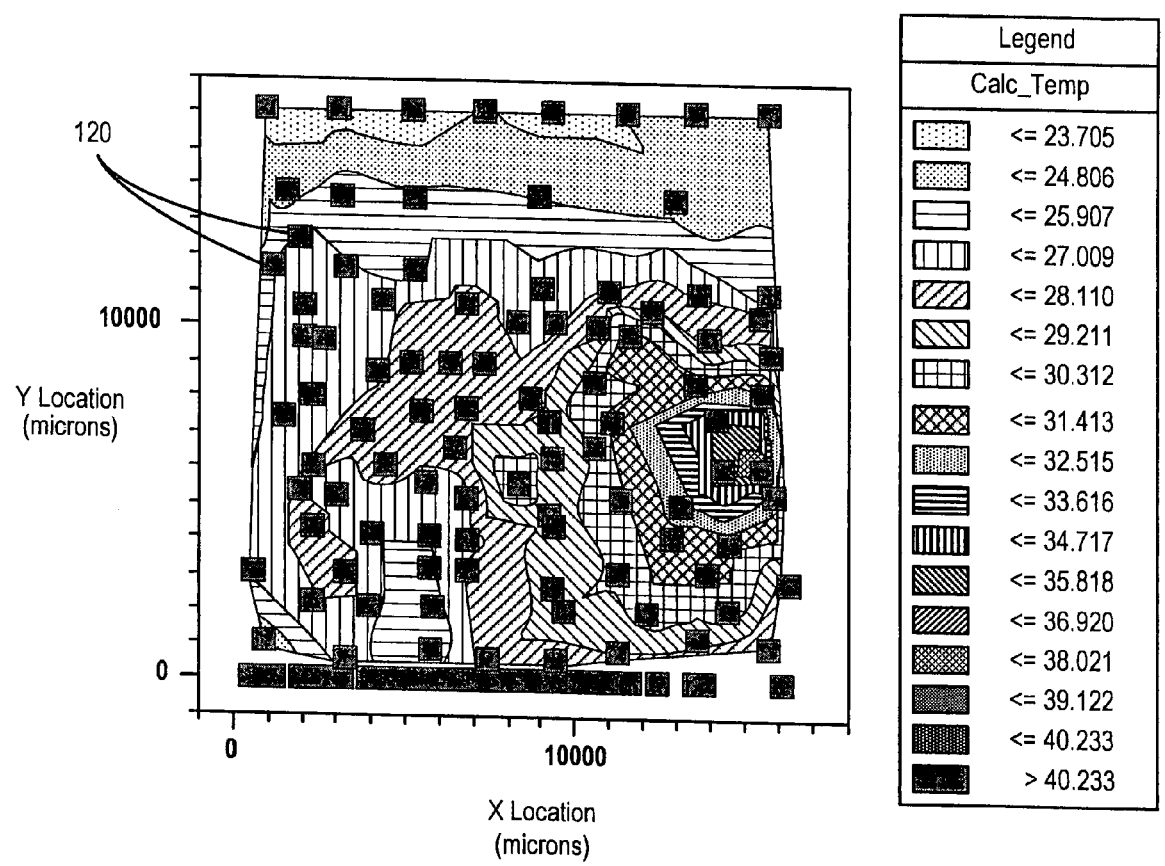
FIG. 8 illustrates another form of a temperature map that may be provided according to some embodiments.

FIG. 8 shows another example of a temperature map that may be generated according to some embodiments based on the local temperatures calculated at 108. In the drawing, the small black squares (some indicated by reference numeral 120) represent the locations of the fublets on the IC die, and the different kinds of shading, which may be represented by different colors in some embodiments, are indicative of the varying local temperatures.

The temperature maps of FIGS. 7 and/or 8 may be displayed on a display component of the test set-up 40 and/or printed out by a printer of the test set-up 40.

In some embodiments, a "motion picture" presentation of local temperature variations may be generated from a sequence of temperature maps (like, e.g., the temperature map of FIG. 8) to aid in analyzing issues such as the thermal time constant of the DUT and/or hot spot to cold spot differential temperatures. To form such a motion picture presentation, successive temperature maps may be generated at time intervals while exercising the DUT. For example, the DUT may be placed in a low power mode for one second and the oscillator data may then be collected to generate a first temperature map. Next, the DUT may be caused to run a maximum power application for one complete set of functional instructions, and then oscillator data may be collected again to generate another temperature map. The DUT may then be caused to run the maximum power application in an infinite loop, and oscillator data may be collected at 1 millisecond intervals during this time to generate further temperature maps for the motion picture presentation. The infinite loop execution of the maximum power application and the collection of oscillator data may continue until the DUT reaches a thermal equilibrium. For example, where the DUT is an IC that is packaged with an integrated heat spreader (IHS), reaching thermal equilibrium may take five to seven seconds. On the other hand, where the DUT is a bare die, only one or two seconds may be required to reach thermal equilibrium.

The motion picture presentation of the thermal mapping data may be provided on a display component of the test set-up 40.

A motion picture presentation of temperature maps for the DUT, or even static temperature or supply voltage maps, may be of significant value and interest to engineers charged with functions such as IC design, debug, assembly, quality and reliability.

Referring once more FIG. 3, detection of local variations in power supply voltage, in a process illustrated in a right-hand branch 130 of the flow chart of FIG. 3, may be performed in addition to or instead of the detection of temperature variations described above.

Initially in the branch 130, as indicated at 132, the test set-up 40 may control the DUT 42 to run a suitable test program. For example, the test program may be the same type of maximum power application referred to above in connection with branch 100 in FIG. 3. As another example, the test program may be one that exercises a particular fublet (e.g., a program to cause high speed execution on a floating point calculation unit.)

With the test program running on the DUT, oscillation data for the characterized oscillators is read out via the scan chain 22 and the TAP of the DUT at a first point in time (e.g., at a specific stage of execution of the test program) at which it is desired to detect local variations in power supply voltage. The oscillation data is received by the test set-up 40, as indicated at 134, and is stored in, e.g., the memory device(s) 56. Immediately after reading out the oscillation data at the first point in time, the execution of the test program is stopped (as indicated at 136) and the phase-locked loop (PLL) clocks in the DUT are stopped, to substantially eliminate local voltage level variations in the power plane of the DUT. Then, at a second point in time that is shortly after the stopping of the PLL clocks, oscillation data for the characterized oscillators is read out once more via the scan chain 22 and the TAP of the DUT and is received by the test set-up 40, as indicated at 138. It may be desirable for the second point in time to be long enough after the stopping of the PLL clocks to allow oscillations in the power supply voltage level to settle out, but not so long as to allow for a significant change in the local temperatures in the DUT. For example, the second point in time may be about 500 microseconds after the stopping of the PLL clocks. The oscillation data received at the second point in time may also be stored in the memory device(s) 56.

Since the PLL clocks are stopped at the second point in time, it may be assumed that the local power supply voltage level is known for all of the characterized oscillators. Consequently, as indicated at 140, a respective local temperature at each of the characterized oscillators may be calculated in the same manner as described above in connection with 108, above. These local temperatures, determined as of the second point in time, may also be assumed to have been present at the first point in time. Thus the influence of local temperature variations on the oscillation data collected at the first point in time is known, and, as indicated at 142, the respective local power supply voltage level at each of the characterized oscillators may be calculated based on the respective local temperature determined at 140 and based on the respective frequency of the characterized oscillator as determined based on the oscillation data collected at the first point in time.

Figure 9:
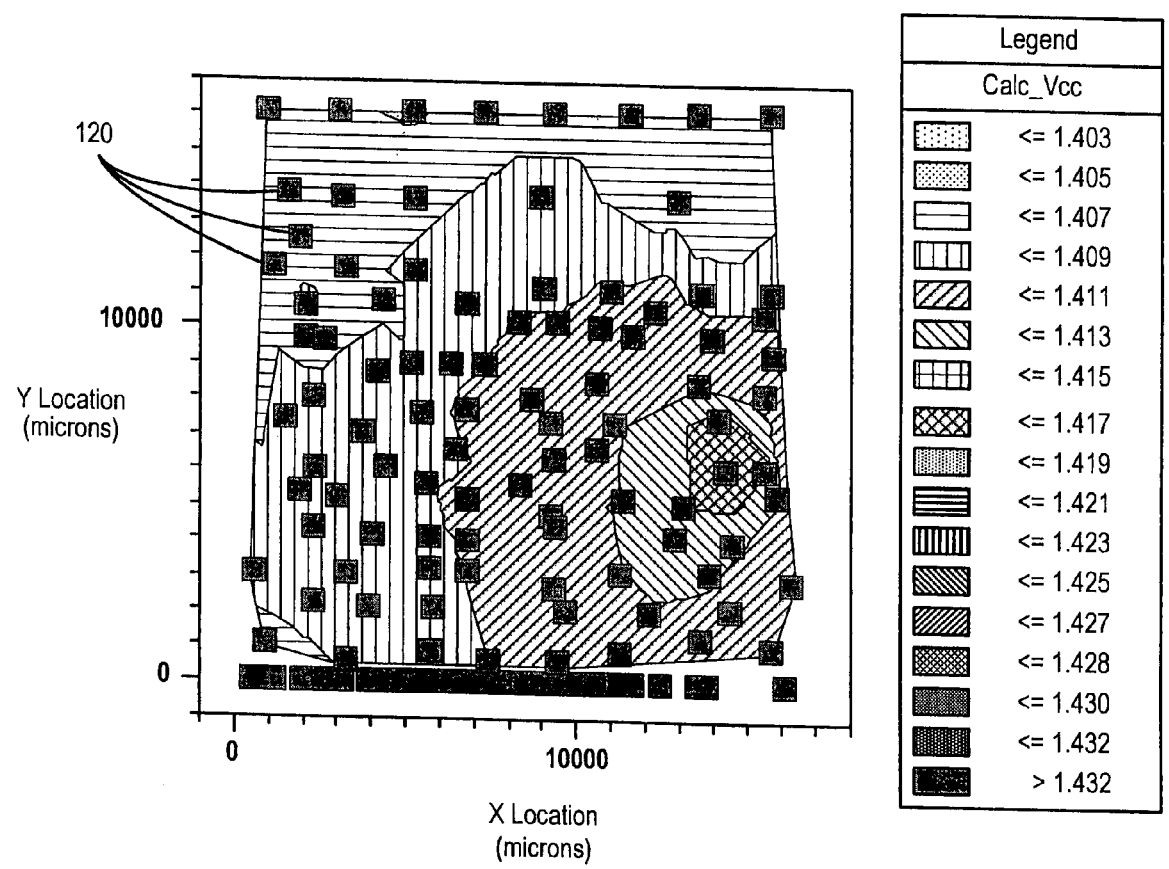
FIG. 9 illustrates an example of a supply voltage map that may be provided according to some embodiments.

Next, as indicated at 144, the processor 44 may operate to generate a supply voltage map for the DUT based on the variations in local power supply voltage determined at 142. One example of such a supply voltage map is shown in FIG. 9. Again, the small black squares (some indicated by reference numeral 120) represent the locations of the fublets on the IC die. The different kinds of shading in FIG. 9, which may be represented by different colors in some embodiments, are indicative of the varying local supply voltage levels.

The voltage map of FIG. 9 may be displayed on a display component of the test set-up 40 and/or printed out by a printer of the test set-up 40.

In the examples given above, one oscillator in each fublet may be characterized and thereafter used for thermal and voltage mapping. In other embodiments, a pair of oscillators in each fublet may be characterized and thereafter used for thermal and voltage mapping. Each pair of oscillators may include a first oscillator and a second oscillator which may be considered "adjacent" to each other in the sense that both are co-located in the same fublet. The first oscillator of each pair may have a temperature- and voltage-dependent frequency function (determined during calibration) that has a first slope, and the second oscillator of each pair may have a temperature- and voltage-dependent frequency function (also determined during calibration) that has a second slope that is substantially different from the first slope. For example, the first slope may incline in a different direction from the second slope (one positive and the other negative) and/or the respective magnitudes of the two slopes may be substantially different. All of the first oscillators of the pairs of oscillators may be designed to be identical (though subject to process variations) and all of the second oscillators of the pairs of oscillators may be designed to be identical (though subject to process variations).

After calibration (which may be in accordance with the process of FIG. 4), oscillator data indicative of temperature and voltage variations may be collected in a single pass at a particular point in time during execution of a program of interest. Since two contrasting characterized oscillators are available for frequency measurement in each fublet, the data indicative of $F_1$ (frequency of the first oscillator) and $F_2$ (frequency of the second oscillator) is available for each fublet, and makes it possible to solve the simultaneous equations:

$$F_1 = a_1 T + b_1 V + c_1$$

$$F_2 = a_2 T + b_2 V + c_2$$

for T and V at each fublet.

It may also be desirable to use IDV oscillator frequency information to detect short-duration fluctuations (e.g., transient changes) in local power supply voltage levels. Because the frequency information is effectively integrated by being measured via a counter at the fublet, there may be limitations on detection of short-duration events.

For example, consider an IDV oscillator that runs at 8 GHZ. This frequency may be pre-scaled by a certain factor before being measured by the counter. If the pre-scaling factor is 128, the counter would report a (scaled) frequency of 62.5 MHz, so that each cycle has a duration of 16 nanoseconds.

Next suppose that a droop event to be captured has a duration of 5 nanoseconds. The number of cycles in the droop event would be 312. Assuming that the droop causes a 5% shift in the scaled frequency, resulting in a reduction from 62.5 MHz to 59.3, the corresponding cycle count from the counter would drop to 296. If the magnitude of the droop were 100 mV, this would translate to a sensitivity of 31 mV/MHz with a minimum resolvable voltage difference of 6.2 mV.

In some alternative designs of the DUT, the pre-scaling factor may be 64 rather than 128. In such a case, the resolution limit would be doubled to 3.1 mV. In still other designs, pre-scaling factors of 32 or 16 may be implemented to further increase resolution. There may be, however, trade-offs involved in providing lower pre-scaling factors, since the size of the counter may need to be increased to accommodate the higher frequencies to be reported by the counters with lower pre-scaling factors.

Typically, it may be necessary for an IDV oscillator to run for 20 microseconds or more to permit accurate measurement of the oscillator's frequency. Consequently, a voltage level event that lasts, say, one microsecond will tend to be "washed out" by the integration involved in the frequency measurement. Also, the magnitude of the event may tend to be distorted as a result of being averaged over the integration window. To mitigate this filtering effect and improve the resolution, it may be desirable to employ a dithering technique that is akin to those described in the following articles: A. S. Fruchter et al., "A novel image reconstruction method applied to deep Hubble Space Telescope images", arXiv: astro-ph/9708242v1, 26 Aug. 1997; Tod R. Lauer, "Combining undersampled dithered images", arXiv:astro-ph/9810394v1, 23 Oct. 1998; A. S. Fruchter et al., "Drizzle: a method for the linear reconstruction of undersampled images", arXiv:astro-ph/9808087v2, 19 Oct. 2001.

More specifically, multiple "snapshots" (readouts of oscillation data) may be taken, each slightly offset in time from the others, to reconstruct the original voltage droop waveform. In other words, the integration time window may be shifted across the droop temporal profile in steps that are some small fraction of the window duration. For instance, if the counter integration window were five microseconds, and 5× "subsampling" were desired, the step size would be equal to one microsecond. Where a droop event is captured in oscillation data, the IDV oscillator data frames in the time domain may be regarded as the convolution of the integration window profile and the voltage droop profile.

Let the window function be expressed as sx(t), and let the droop profile be expressed as sy(t). Then the voltage mapping data frames are the convolution of the sx(t) and sy(t) datasets. The convolution is the product of the respective functions in the Fourier domain, and may be represented as:

$$conv(t)=sx(t)sy(t)=\mathfrak{F}^{-1}[\mathfrak{F}(sx(t))\times\mathfrak{F}(sy(t))].$$

To extract the unknown voltage droop profile $sy_{ext}(t)$ from the convolution, the known window profile is divided into the convolution in the Fourier domain, as indicated below:

$$sy_{ext}(t) = \mathfrak{F}^{-1}\left[\frac{\mathfrak{F}(conv(t))}{\mathfrak{F}(sx(t))}\right].$$

Figure 10:
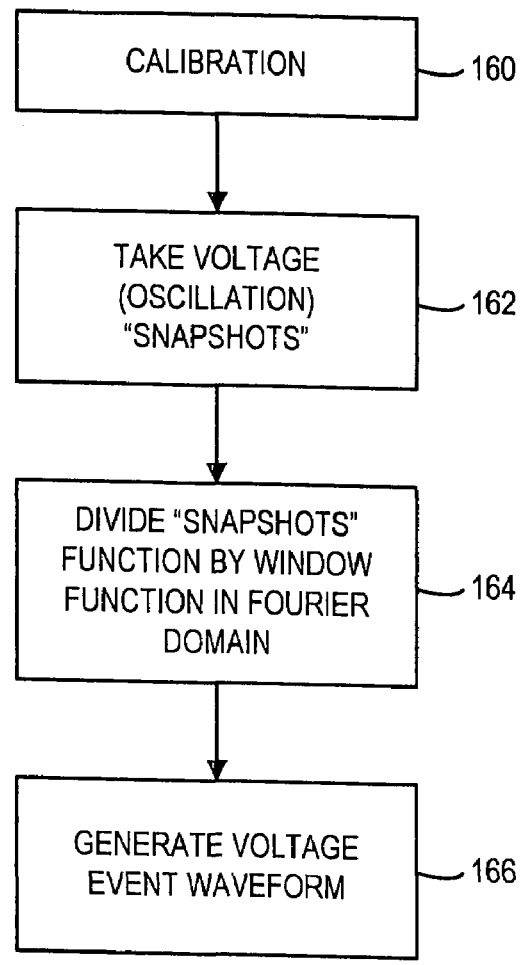
FIG. 10 is a flow chart that illustrates a process performed according to some embodiments to detect a transient change in power supply voltage at a particular location in an IC.

FIG. 10 is a flow chart that illustrates a process that may be performed according to some embodiments to recover a droop event profile from IDV oscillation data. Initially, as indicated at 160, a calibration procedure may be performed, such as the procedure described above with reference to FIG. 4. Next, as indicated at 162, the oscillation data "snapshots" are taken. That is, a respective rate of oscillation of the characterized oscillator at the location of interest is detected at each of a sequence of points in time. The duration of the intervals between the points in time depends on the degree of "subsampling" that is desired. The function indicated by the set of samples produced by the snapshots is then divided in the Fourier domain by a function which corresponds to the counter integration window function (as indicated at 164), and from this result the waveform for the droop in voltage event is generated (as indicated at 166). In this way, a droop event or other transient change in local power supply voltage may be detected based on the respective rates of oscillation of the characterized oscillator at the sequence of points in time.

Figure 11:
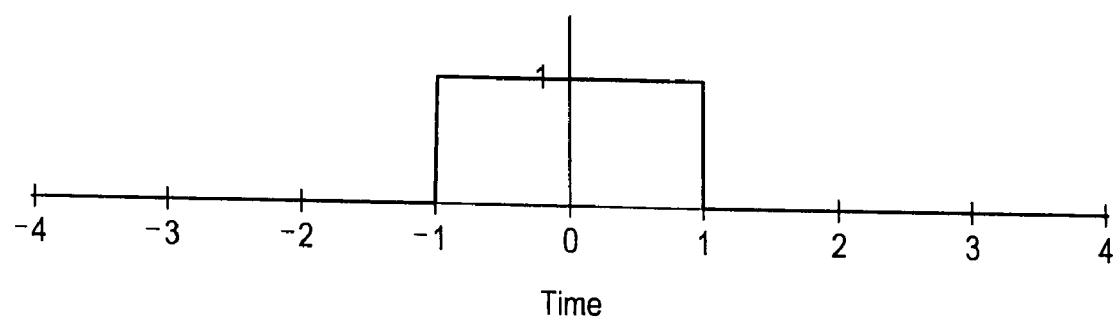
FIG. 11 is a graphical representation of an integration window applied according to some embodiments to oscillation data received from an oscillator in the microprocessor of FIG. 1.
Figure 12:
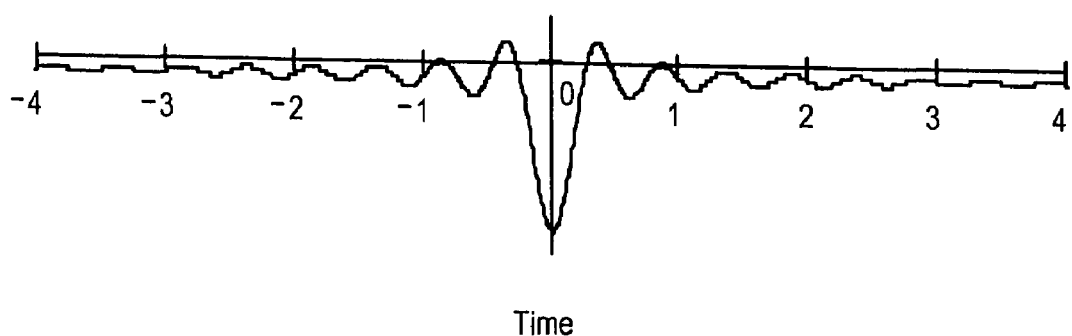
FIG. 12 shows a waveform that represents a simulated transient change in voltage that may occur at a particular location in the microprocessor of FIG. 1.
Figure 13:
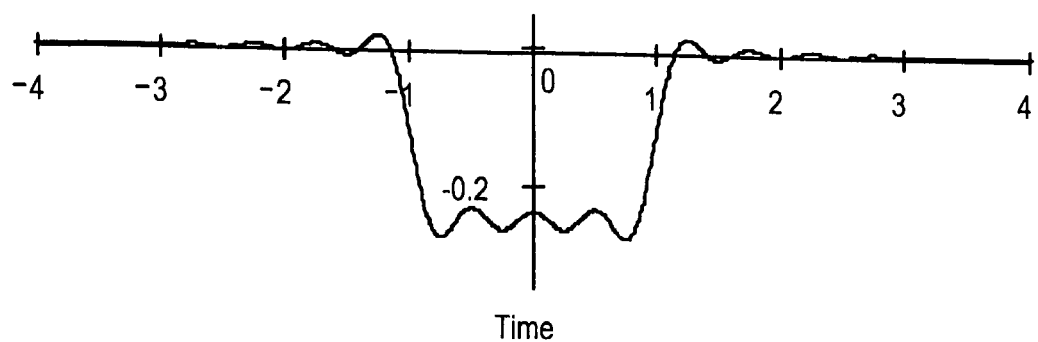
FIG. 13 shows a waveform that represents a simulated signal that may be derived from oscillation data received from an oscillator in the microprocessor of FIG. 1.
Figure 14:
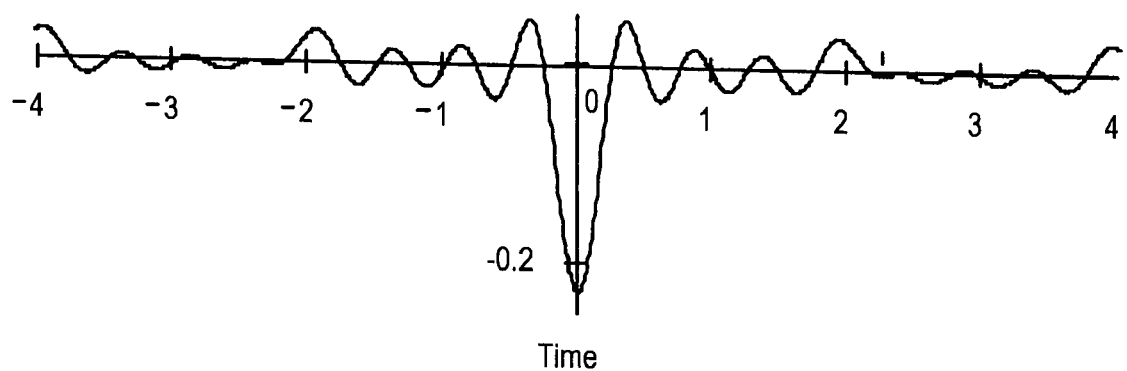
FIG. 14 shows a waveform that represents a simulated signal that is recovered by post-processing from the signal illustrated in FIG. 13.

FIGS. 11-14 graphically illustrate aspects of the process of FIG. 10. FIG. 11 shows a simulated integration window profile in the time domain. FIG. 12 shows a simulated example droop profile to be detected, assumed to be a −sinc(t) function. FIG. 13 shows the convolution of the waveforms of FIGS. 11 and 12, and thus represents a simulated function indicated by the snapshot data. FIG. 14 shows a simulated waveform of a droop event profile as recovered from the snapshot data using the process of FIG. 10. Note the distortion and aliasing at the edges of the waveform of FIG. 14, resulting from the original sinc(t) function being truncated in the evaluation.

Figure 15:
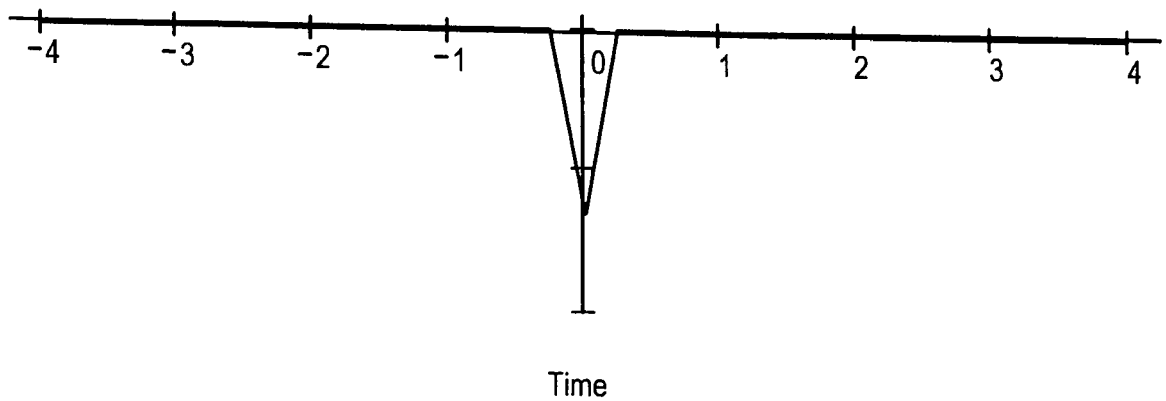
FIGS. 15-17 show respective waveforms that illustrate the effects of respective degrees of subsampling on the resolution at which a transient voltage event signal may be recovered.
Figure 16:
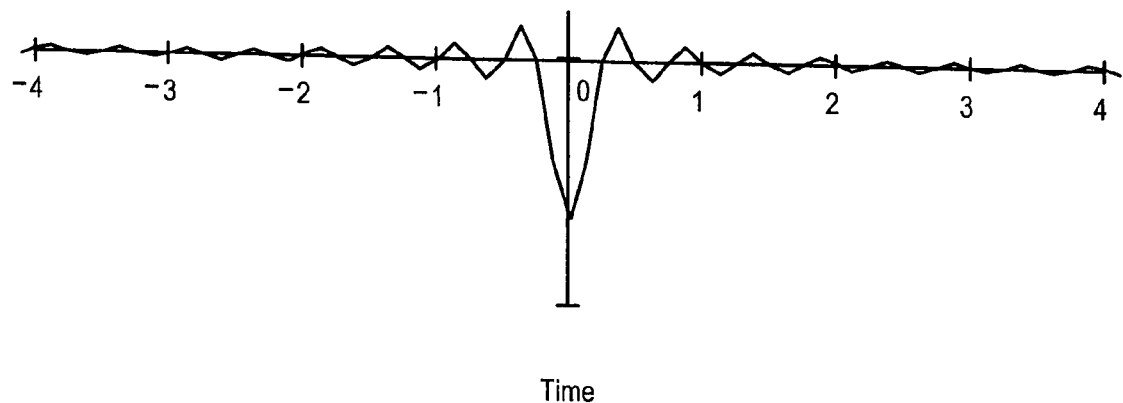
Figure 17:
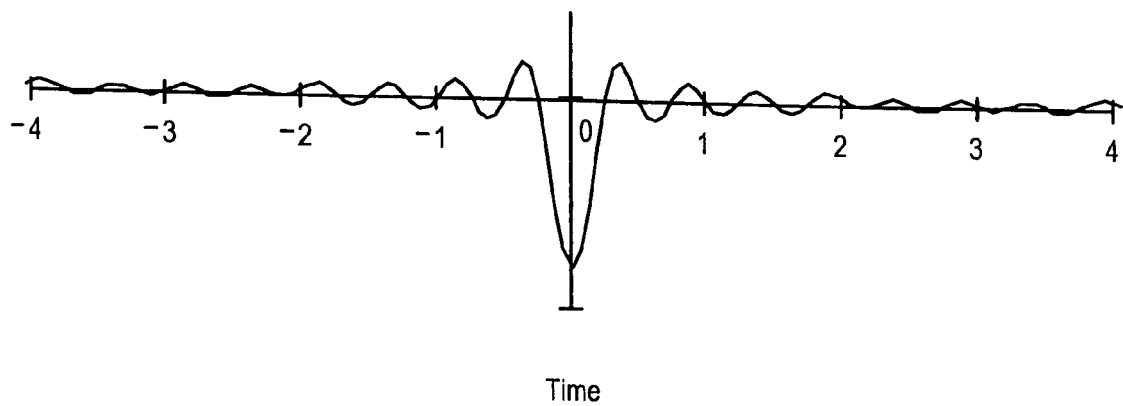

FIGS. 15-17 illustrate the varying effects of the degree of subsampling employed upon the resolution obtained for the recovered droop profile waveform. FIG. 15 shows a simulated recovered droop profile waveform when 4× subsampling is employed; FIG. 16 shows a simulated recovered droop profile waveform when 8× subsampling is employed; FIG. 17 shows a simulated recovered droop profile waveform when 16× subsampling is employed. In general, as the subsampling shift step becomes a larger percentage of the window duration, the fidelity of the recovered profile waveform is degraded as higher frequency information is lost. It may be desirable to select a sub-sampling rate that is critically sampled at least twice the highest temporal frequency component that is to be detected. For example, to detect a voltage droop event having a duration of about one microsecond using a 10 microsecond time window, it may be desirable to employ a sub-sampling rate of 20× or higher.

The thermal and voltage mapping described herein and/or the detection of transient voltage events, may allow for improved IC debugging procedures. For example, the thermal mapping described herein may be an attractive alternative to examination by IREM, since the thermal mapping described herein does not require such difficult and time-consuming steps as removal of a heat spreader and thinning of the IC die. In some embodiments, the thermal mapping described herein may take as little as on the order of ten minutes.

The thermal mapping techniques described herein may also be more accurate for determining the thermal resistance and non-uniform thermal impedance of a packaged die than conventional techniques which employ thermal replicas of an IC die.

The thermal mapping techniques described herein may also be less time-consuming and expensive for detecting voids in the thermal interface material that couples the IC die to a heat spreader, as compared to a conventional techniques such as c-mode scanning acoustic microscopy (CSAM). Since only a differential measurement may be needed rather than absolute temperature results, it may be possible to forego the calibration procedure described herein.

The process for detecting voids may involve, first, measuring the IDV oscillator frequency for a given type of oscillator at each fublet at a very low applied voltage, just enough for the DUT to be functional. The low voltage level may be employed to reduce self-heating and to reduce the effects of leakage. Then the DUT may be subjected to very high voltages just below the burn-in voltage. The DUT may then be subjected to a near uniform heating pattern such as PLL warm up, or if the DUT has sufficient leakage, may be allowed to self-heat long enough to reach a steady state. Achievement of the steady state may be monitored via the thermal diode.

Once the DUT has reached the steady state, the voltage may be reduced suddenly to the initial low voltage. After a predetermined period of delay, long enough for voltage droops to settle, but not enough for temperature to change significantly, another measurement of the IDV oscillator frequency of the selected oscillators may be performed. The presence of voids may be detected by comparing the two IDV measurements with a standard profile of uniform power.

The voltage mapping technique described above may be applicable to speed-path debugging. With the voltage mapping technique described above, a debugging engineer may be able to observe voltage across the power plane of the DUT at the point in time that a failure occurs during speed-path debugging. The debugging engineer may then be able to detect voltage anomalies at the point of failure, and to address the anomalies with power-delivery design alternatives or other steps.

The temperature and voltage mapping techniques described herein may eliminate any need for finite element analysis or simulation or extrapolation, and are non-destructive, non-intrusive and do not require sample preparation. Moreover, the temperature and voltage mapping techniques described herein, as well as the voltage event detection technique described herein, may promote less difficult, less time consuming and more effective design, validation and testing of ICs, such as microprocessors. Further the techniques described herein may not entail major costs. The components of the test set-up described herein, such as the temperature control device and the interface to the DUT TAP, may not require large expenditures.

The techniques described above also may not be limited to relatively low temperature and/or relatively low frequency applications, as is the case with IREM examination.

In general, the techniques described herein may allow design, debug, test, reliability and validation engineers to increase their understanding of operating characteristics of ICs, thereby improving and facilitating the design process. In addition, yields and frequency binning for IC production may be improved with the information available from temperature and voltage mapping as described herein. Also, the thermal mapping described herein may aid in design of thermal management and power delivery systems for microprocessors and other ICs.

In embodiments described above, the data indicative of the oscillation rate of the oscillators has been read out from the DUT in the form of a digital count provided by a counter or counters on the DUT. Alternatively, however, an analog oscillation signal provided by an oscillator may be taken off from the die of the DUT and then processed off-die to yield oscillation rate data for the oscillator.

Although the embodiments described herein have been presented in the context of a microprocessor, it should be understood that the techniques described herein are also applicable to other types of ICs. The number of fublets from which IDV oscillator data may usefully be gathered may vary according, e.g., to the type of IC, and may range, for example, from 5 or 25 or 50 or more to upwards of 100.

In embodiments described above, detection of local temperature and/or supply voltage variations based on IDV oscillator frequencies has been applied in a test and/or design context. In addition, or alternatively, IDV oscillator frequencies may be detected and used to determine local and/or die-wide temperature and/or supply voltage conditions when the IC is installed in an end user device. For example, such temperature and/or supply voltage data may be used to control cooling systems and/or power supply systems in the end user device during operation of the end user device.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:
   providing an integrated circuit (IC) having a plurality of oscillators at distributed locations in the IC, the IC being a microprocessor;
   determining a respective rate of oscillation of each of the oscillators;
   detecting variations in local power supply voltage in the IC based on the determined rates of oscillation;
   running an application program on the IC; and
   after running the application program, placing the IC in a condition in which no program is running on the IC;
   and wherein:
   the determining is performed both with the application program running and with the IC in the condition in which no program is running; and
   the detecting of the local variations in power supply voltage includes:
   detecting a respective local temperature at each of the oscillators based on the respective rate of oscillation of each the oscillators with the IC in the condition in which no program is running; and
   calculating a respective local power supply voltage at each of the oscillators based on the detected respective local temperature at each of the oscillators and based on the respective rate of oscillation of each of the oscillators with the application program running on the IC.

2. The method of claim 1, wherein the determining includes receiving data from a test access port of the IC.

3. The method of claim 1, wherein the oscillators are ring oscillators.

4. The method of claim 1, wherein the plurality of oscillators includes at least 50 oscillators.

5. The method of claim 1, further comprising:
   generating a supply voltage map for the IC based on the detected variations in local power supply voltage.

6. The method of claim 1, further comprising:
   performing a calibration procedure prior to the determining, the calibration procedure comprising:
   determining respective rates of oscillation of the oscillators at various temperatures applied to the IC; and
   determining respective rates of oscillation of the oscillators at various voltages applied to the IC.

* * * * *